United States Patent
Igarashi et al.

(10) Patent No.: US 7,315,083 B2
(45) Date of Patent: Jan. 1, 2008

(54) CIRCUIT DEVICE AND MANUFACTURING METHOD THEREOF

(75) Inventors: Yusuke Igarashi, Gunma (JP); Takeshi Nakamura, Gunma (JP); Yasunori Inoue, Gifu (JP); Hideki Mizuhara, Aichi (JP); Ryosuke Usui, Aichi (JP)

(73) Assignee: Sanyo Electric Co., Ltd., Moriguchi, Osaka (JP)

( * ) Notice: Subject to any disclaimer, the term of this patent is extended or adjusted under 35 U.S.C. 154(b) by 0 days.

(21) Appl. No.: 11/141,461

(22) Filed: May 31, 2005

(65) Prior Publication Data

US 2005/0263911 A1 Dec. 1, 2005

(30) Foreign Application Priority Data

May 31, 2004 (JP) .......................... P2004-162652

(51) Int. Cl.
- H01L 23/48 (2006.01)
- H01L 23/52 (2006.01)
- H01L 29/40 (2006.01)

(52) U.S. Cl. ............ 257/758; 257/750; 257/762; 257/773; 257/775; 257/776; 257/793; 257/795; 257/E29.165; 257/E21.537

(58) Field of Classification Search ............... 257/664, 257/665, 734–786, 793, 795, E29.111, E29.165, 257/E23.01, E23.079, E23.141, E23.179, 257/E21.537, E21.539
See application file for complete search history.

(56) References Cited

U.S. PATENT DOCUMENTS

| 5,945,258 | A | 8/1999 | Shimizu et al. | |
|---|---|---|---|---|
| 6,864,121 | B2 | 5/2002 | Sakamoto et al. | |
| 6,528,874 | B1 | 3/2003 | Iijima et al. | |
| 6,680,530 | B1 * | 1/2004 | Pillai et al. | 257/700 |
| 6,717,267 | B1 | 4/2004 | Kunikiyo | |
| 6,724,638 | B1 * | 4/2004 | Inagaki et al. | 361/763 |
| 6,759,740 | B2 * | 7/2004 | Onitani et al. | 257/705 |
| 6,787,918 | B1 * | 9/2004 | Tsai et al. | 257/778 |
| 6,803,658 | B2 * | 10/2004 | Suzuki | 257/737 |
| 6,896,953 | B2 * | 5/2005 | Taga et al. | 428/210 |
| 7,091,593 | B2 * | 8/2006 | Ishimaru et al. | 257/686 |
| 2003/0011070 | A1 * | 1/2003 | Iijima et al. | 257/734 |
| 2003/0062624 | A1 * | 4/2003 | Asahi et al. | 257/758 |
| 2003/0160325 | A1 * | 8/2003 | Yoneda et al. | 257/758 |
| 2004/0262644 | A1 * | 12/2004 | Naruse et al. | 257/226 |

FOREIGN PATENT DOCUMENTS

| CN | 1140973 A | 1/1997 |
|---|---|---|
| CN | 1292635 A | 4/2001 |
| CN | 1304175 A | 7/2001 |
| CN | 1348205 A | 2/2002 |
| JP | 06-177295 | 6/1994 |
| JP | B-3549316 | 12/1996 |
| KR | A 2001 274333 | 12/1997 |

* cited by examiner

Primary Examiner—Jasmine Clark
(74) Attorney, Agent, or Firm—Fish & Richardson P.C.

(57) ABSTRACT

A circuit device suitable for connecting a plurality of laminated wiring layers to each other through an insulating layer, and a manufacturing method thereof are provided. According to a hybrid integrated circuit device of the present invention and a manufacturing method thereof, a first conductive film is laminated on a first insulating layer, and a first wiring layer is formed by patterning the first conductive film. Next, a second conductive film is laminated on a second insulating layer. Thereafter, by partially removing the second insulating layer and the second conductive film in a desired spot, a connection part for connecting the wiring layers to each other is formed.

9 Claims, 16 Drawing Sheets

FIG.16A
(PRIOR ART)
FIG.16B
(PRIOR ART)
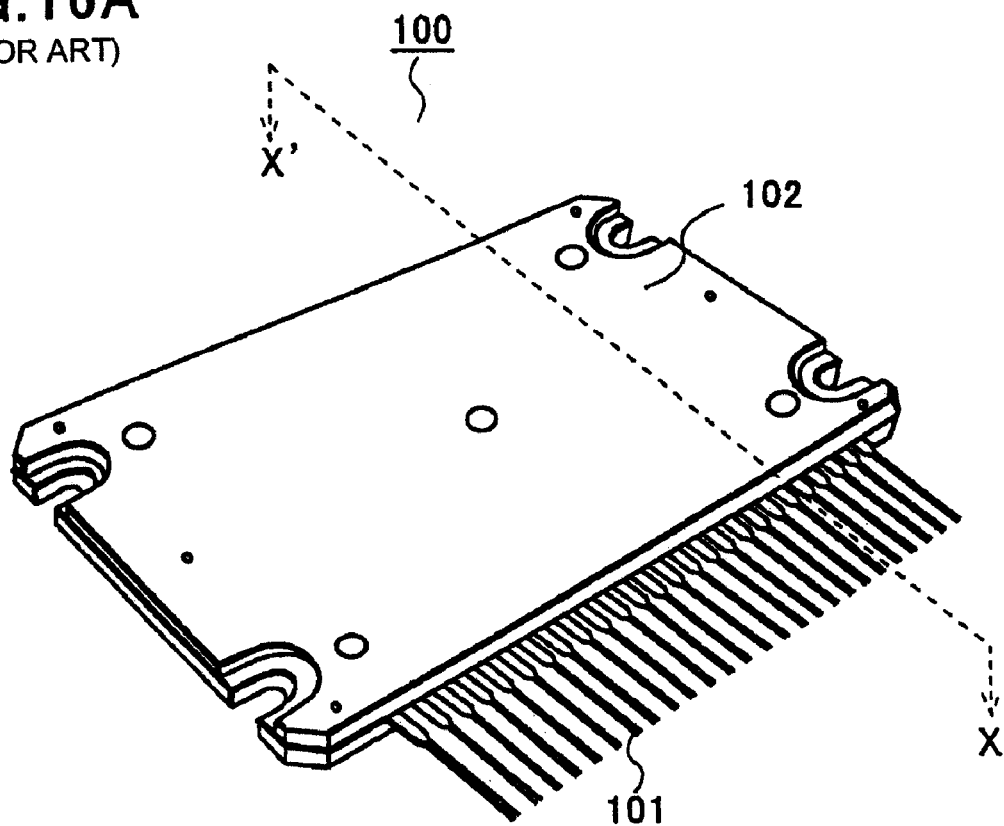
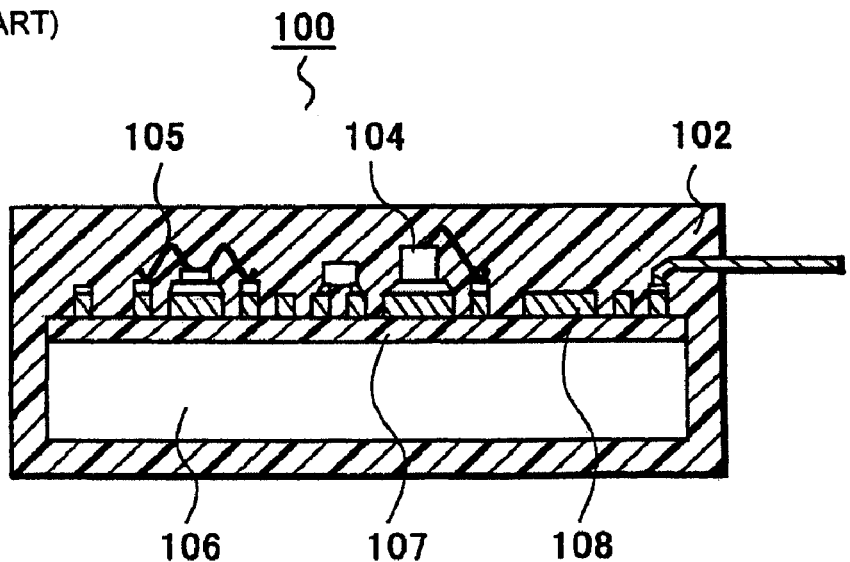

CIRCUIT DEVICE AND MANUFACTURING METHOD THEREOF

BACKGROUND OF THE INVENTION

Priority is claimed to Japanese Patent Application Number JP2004-162652 filed on May 31, 2004, the disclosure of which is incorporated herein by reference in its entirety.

1. Field of the Invention

The present invention relates to a circuit device and a manufacturing method thereof, and more particularly relates to a circuit device including a plurality of wiring layers laminated with an insulating layer interposed therebetween, and a manufacturing method thereof.

2. Description of the Related Art

With reference to FIGS. 16A and 16B, a description will be given of a configuration of a conventional hybrid integrated circuit device 100. This technology is described for instance in Japanese Patent Application Publication No. Hei 6 (1994)-177295. FIG. 16A is a perspective view of the hybrid integrated circuit device 100, and FIG. 16B is a cross-sectional view along the line X-X' in FIG. 16A.

The conventional hybrid integrated circuit device 100 includes a rectangular substrate 106, and an insulating layer 107 provided on the surface of the substrate 106. On this insulating layer 107, a wiring layer 108 is patterned. Furthermore, a circuit element 104 is fixed on the wiring layer 108, and the circuit element 104 and the wiring layer 108 are electrically connected to each other by use of a thin metal wire 105. A lead 101 electrically connected to the wiring layer 108 is extended to the outside. Moreover, the entire hybrid integrated circuit device 100 is sealed with a sealing resin 102. As a method for sealing the device with the sealing resin 102, there are injection molding using a thermoplastic resin, and transfer molding using a thermosetting resin.

However, in the hybrid integrated circuit device 100 described above, formation of a single layer of wiring leads to a problem that limits a size of an electric circuit that can be integrated. As one of methods for solving this problem, there is a method for forming a multilayer structure of wirings laminated with an insulating layer interposed therebetween. The laminated wiring layers are electrically connected to each other through a connection part formed so as to penetrate the insulating layer. Moreover, in consideration of heat release properties, the insulating layer has inorganic fillers mixed therein. However, in the case where a large amount of inorganic fillers are mixed in the insulating layer in order to improve the heat release properties, there is a problem that it is difficult to form the connection part so as to penetrate the insulating layer. Specifically, it is difficult to form a multilayer wiring structure which secures the heat release properties.

SUMMARY OF THE INVENTION

The present invention was made in consideration for the foregoing problems. The present invention provides a circuit device which achieves both high heat release and densification, and a manufacturing method thereof. According to the present invention, an increase in a temperature of an LSI to be mounted is prevented. Thus, drive ability is maintained, and total energy consumption is reduced.

A circuit device of the present invention includes: first and second wiring layers which are laminated with an insulating layer interposed therebetween; a first connection part which is provided continuously from the first wiring layer and buried in the insulating layer; and a second connection part which is provided continuously from the second wiring layer and buried in the insulating layer. In the circuit device, the first and second connection parts come into contact with each other in an intermediate portion of the insulating layer in its thickness direction.

A method for manufacturing a circuit device of the present invention includes the steps of: forming a first wiring layer on the surface of a circuit board; laminating a second conductive film on the first wiring layer with an insulating layer containing inorganic fillers interposed therebetween; forming a through-hole by removing the second conductive film and the insulating layer in a desired spot, and exposing the first wiring layer in the lower side of the through-hole; connecting the second conductive film and the first wiring layer by forming a plated film in the through-hole; and forming a second wiring layer by patterning the second conductive film.

Moreover, a method for manufacturing a circuit device of the present invention includes the steps of: forming a first wiring layer on the surface of a circuit board, the first wiring layer having a first connection part protruded in a thickness direction; laminating a second conductive film on the first wiring layer with an insulating layer containing inorganic fillers interposed therebetween; partially removing the second conductive film corresponding to a region where the first connection part is formed; forming a through-hole by removing the insulating layer in a region which is thinly formed by burying the first connection part therein, and exposing the upper surface of the first connection part in the lower side of the through-hole; connecting the second conductive film and the first wiring layer by forming a second connection part made of a plated film in the through-hole; and forming a second wiring layer by patterning the second conductive film.

Furthermore, a method for manufacturing a circuit device of the present invention includes the steps of: forming a first wiring layer on the surface of a circuit board, the first wiring layer having a first connection part protruded in a thickness direction; forming an insulating layer so as to cover the first wiring layer; forming a through-hole which exposes the upper surface of the first connection part by removing the insulating layer in a portion corresponding to the first connection part; forming a second connection part which comes into contact with the first connection part and is buried in the through-hole, and forming a second wiring layer which is integrated with the second connection part; and fixing a semiconductor element which is electrically connected to the second wiring layer.

Furthermore, a circuit device of the present invention at least includes a supporting board having at least its surface insulated, and a semiconductor element formed on the supporting board. In the circuit device, a second wiring layer is provided on a first wiring layer on the supporting board with an insulating layer interposed therebetween. In addition, in a portion corresponding to an electrical connection part between the first and second wiring layers, provided are a first connection part facing upward integrally with the first wiring layer, and a second connection part facing downward integrally with the second wiring layer. Moreover, a portion where the first and second connection parts come into contact with each other is positioned between the upper surface of the first connection part and the lower surface of the second connection part.

According to the circuit device of the present invention, the first connection part is provided in the first wiring layer, and the second connection part is provided in the second wiring layer. Moreover, the first and second connection parts come into contact with each other in the intermediate portion in the thickness direction of the insulating layer on which the first and second wiring layers are laminated. Therefore, it is possible to improve reliability of the connection parts for external force such as thermal stress. Moreover, either the first connection part or the second connection part is formed integrally with any of the wiring layers by processing a copper foil. Thus, the mechanical strength of the connection parts can be improved.

According to the method for manufacturing a circuit device of the present invention, even if a plurality of wiring layers are laminated with an insulating layer interposed therebetween, the insulating layer having a large number of inorganic fillers mixed therein, it is possible to form a connection part which penetrates the insulating layer and connects the wiring layers to each other.

Moreover, the through-hole is provided in the insulating layer which is thinly formed by burying the first connection part. Thus, the through-hole can be easily formed in the insulating layer. Furthermore, since a shallow through-hole can be formed, a plated film can be easily formed in the through-hole.

Furthermore, after the through-hole is formed in the insulating layer, it is possible to form, by electroplating, a plated film from the second conductive film positioned around the upper part of the through-hole. Therefore, even under poor conditions for forming the plated film, the plated film can be formed.

BRIEF DESCRIPTION OF THE DRAWINGS

FIG. 16A is a perspective view and FIG. 16B is a cross-sectional view showing a conventional hybrid integrated circuit device.

DESCRIPTION OF THE EMBODIMENTS

First Embodiment

Figure 1A:
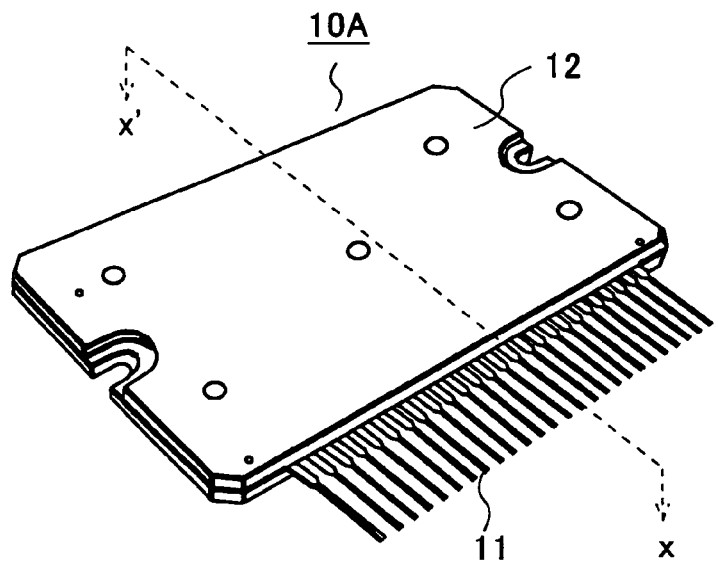
FIG. 1A is a perspective view and FIGS. 1B and 1C are cross-sectional views showing a hybrid integrated circuit device according to an embodiment of the invention.
Figure 1B:
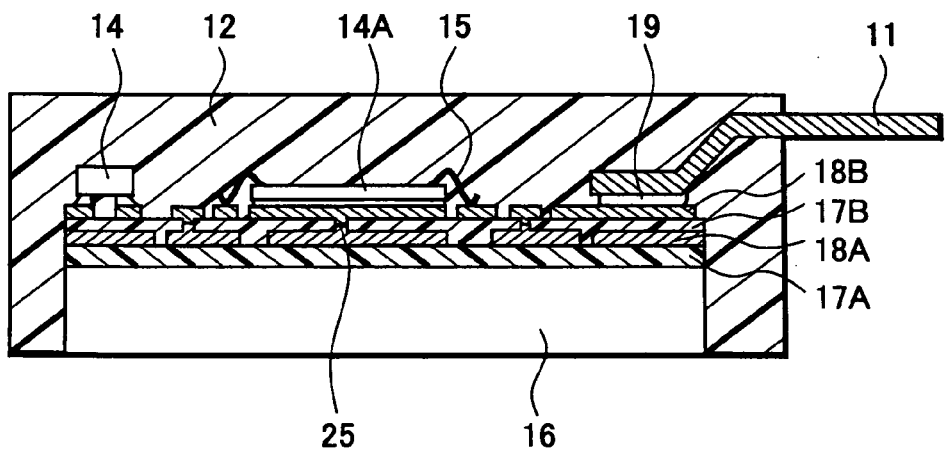
Figure 1C:
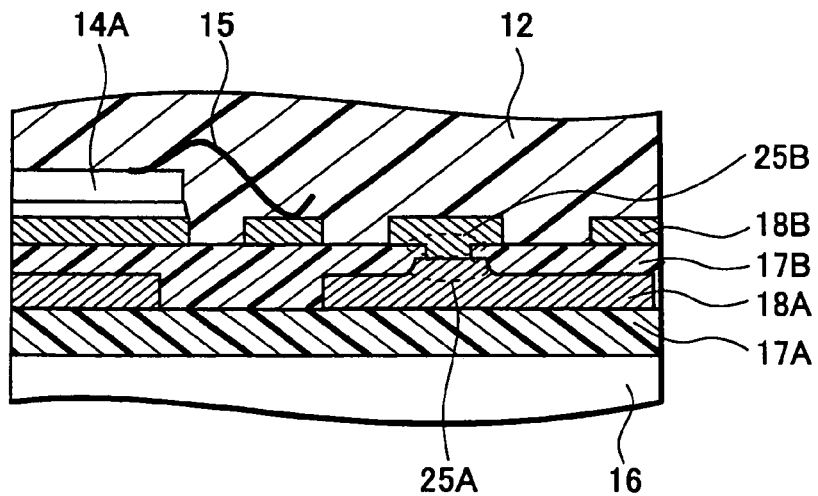

In this embodiment, as an example of a circuit device, a hybrid integrated circuit device as shown in FIGS. 1A to 1C and the like will be described. However, the embodiment described below is also applicable to other kinds of circuit devices. Moreover, the embodiment described below is also applicable to a circuit board and a manufacturing method thereof.

With reference to FIGS. 1A to 1C, a configuration of a hybrid integrated circuit device 10 according to the embodiment of the present invention will be described. FIG. 1A is a perspective view of the hybrid integrated circuit device 10, and FIG. 1B is a cross-sectional view along the line X-X' in FIG. 1A. FIG. 1C is an enlarged cross-sectional view around a connection part 25.

In the hybrid integrated circuit device 10, with reference to FIGS. 1A and 1B, an electric circuit including wiring layers 18 and a circuit element 14 is formed on the surface of a circuit board 16 which functions as a supporting board. Moreover, the electric circuit formed on the surface of the circuit board 16 is sealed with a sealing resin 12. In a periphery of the circuit board 16, a lead 11 is fixed to an uppermost wiring layer 18, and an end of the lead 11 is extended to the outside of the sealing resin 12. Here, the lead 11 can also be fixed to a wiring layer other than the uppermost wiring layer. In this embodiment, the wiring layers 18 have a multilayer wiring structure. Here, a two-layer wiring structure is realized, which includes a first wiring layer 18A and a second wiring layer 18B. The respective wiring layers 18 are laminated with insulating layers interposed therebetween. The hybrid integrated circuit device 10 having such a configuration will be described in detail below.

In terms of heat release, a board made of metal, ceramic or the like may be used as the circuit board 16. Moreover, for a material of the circuit board 16, Al, Cu, Fe or the like can be used as metal, and $Al_2O_3$ or AlN can be used as ceramic. Besides the above, a material excellent in mechanical strength or heat release properties can be used as the material of the circuit board 16.

Moreover, in order to realize a contact structure that is the point of the present application, if the heat release properties are ignored, a flexible board, a printed board, a glass epoxy board or the like can be adopted. In this embodiment, in consideration of the heat release properties, an insulating layer 17 is formed on the surface of the circuit board 16 made of aluminum, and the wiring layer 18 is formed thereon. In addition, in this embodiment, metal mainly made of copper can also be used as the material of the circuit board 16. Since copper has an excellent thermal conductivity, the heat release properties of the entire device can be improved. Moreover, if Al is used as the material of the circuit board 16, an oxide film may be formed on the surface of the circuit board 16.

A first insulating layer 17A is formed on the surface of the circuit board 16 so as to substantially cover the entire surface thereof. As the first insulating layer 17, a resin containing fillers can be used. Here, as the fillers, for example, aluminum compounds, calcium compounds, potassium compounds, magnesium compounds or silicon compounds can be used. Moreover, in order to improve the heat release properties of the entire device, the first insulating layer 17A contains more fillers than the other insulating layer, and a filler content is, for example, about 60% to 80%. Furthermore, the heat release properties can also be improved by mixing fillers having a large diameter of 50 µm or more in the first insulating layer 17A. A thickness of the first insulating layer 17A is changed depending on a required withstand pressure, and may be about 50 µm to several hundred µm.

The first wiring layer 18A is made of metal such as copper, and is patterned on the surface of the first insulating layer 17A. The first wiring layer 18A is electrically connected to the second wiring layer 18B thereabove, and mainly has a function of making a crossover and extending a pattern.

A second insulating layer 17B is formed on the surface of the circuit board 16 so as to cover the first wiring layer 18A. In the second insulating layer 17B, a connection part 25 which electrically connects the first wiring layer 18A and the second wiring layer 18B is formed so as to penetrate the second insulating layer 17B. Therefore, in order to facilitate formation of the connection part 25, the second insulating layer 17B may contain fewer fillers than the first insulating layer 17A. This means that the second insulating layer 17B has a small filler content. Furthermore, for the same reason, a maximum particle diameter of the fillers contained in the second insulating layer 17B may be smaller than that of the fillers contained in the first insulating layer 17A.

The second wiring layer 18B is formed on the surface of the second insulating layer 17B. The second wiring layer 18B forms a land on which the circuit element 14 is mounted, pads connected to electrodes on the circuit element, a wiring part which electrically connects the respective pads, a pad on which the lead 11 is fixed, and the like. Moreover, the second wiring layer 18B and the first wiring layer 18A can be formed so as to planarly intersect with each other. Therefore, even if a semiconductor element 14A has a number of electrodes, the multilayer wiring structure of the present application enables a crossover and makes it possible to freely extend the pattern. The second wiring layer 18B and the first wiring layer 18A described above are connected to each other in a desired spot through the connection part 25. It is needless to say that, in accordance with the number of electrodes of the semiconductor element, a packaging density of elements, and the like, 3, 4, 5 or more of wiring layers can also be provided.

The connection part 25 is a part which penetrates the second insulating layer 17B and electrically connects the first wiring layer 18A and the second wiring layer 18B. In this embodiment, the connection part 25 is formed of a first connection part 25A extended continuously from the first wiring layer 18A, and a second connection part 25B extended continuously from the second wiring layer 18B. More details about the connection part 25 will be described later with reference to FIG. 1C.

The circuit element 14 is fixed onto the second wiring layer 18B, and the circuit element 14 and the wiring layer 18 form a predetermined electric circuit. As the circuit element 14, an active element such as a transistor, a diode, an IC, and a system LSI, or a passive element such as a condenser and a resistor is adopted. Moreover, an element with a large calorific value such as a power semiconductor element may be fixed with a heat sink made of metal. Here, since the semiconductor element is mounted face up, the element is electrically connected to the second wiring layer 18B with a thin metal wire 15. However, the element may be mounted face down.

Here, the system LSI means a large scale element which has an analog computing circuit, a digital computing circuit, a storage part or the like, and realizes system functions in one LSI. Therefore, compared to a conventional LSI, the system LSI is operated with generation of a large amount of heat.

In this embodiment, a system in package called a SIP, a wafer scale CSP, and the like can be employed as the circuit element 14. As the SIP, there are a stack type including a plurality of chips laminated, and a plane type in which a number of semiconductor element and a passive element are planarly disposed and molded.

Moreover, if the rear surface of the semiconductor element 14A is connected to a ground potential, the rear surface thereof is fixed by use of a brazing material, a conductive paste or the like. Moreover, if the rear surface of the semiconductor element 14A is in a floating state, the rear surface thereof is fixed by use of an insulating adhesive. Note that, if the semiconductor element 14A is mounted face down, the element is mounted by means of a bump electrode made of solder or the like.

Furthermore, as the semiconductor element 14A, a power transistor which controls a large current, for example, a power MOS, a GTBT, an IGBT, a thyristor, and the like can be adopted. Moreover, a power IC can also be adopted as the semiconductor element 14A.

In recent years, since a chip is small, thin, and sophisticated, an amount of heat generated has been increased each year in the entire device or the entire module as shown in FIGS. 1 and 6. That is the case for a CPU which controls a computer, and the like, for example. Although the number of elements included has significantly been increased, a Si chip itself has become thinner and smaller. Thus, an amount of heat generated per unit area has been increased each year. Moreover, since a number of ICs and transistors are mounted, heat generated in the entire device has been incomparably increased.

The lead 11 is fixed to the second wiring layer 18B in the periphery of the circuit board 16, and has a function of performing input/output from/to the outside, for example. Although, here, a number of the leads 11 are provided on one side, the leads may be arranged on two opposite sides or four sides. The leads 11 are attached to the pattern by use of a brazing material 19 such as solder.

The sealing resin 12 is formed by transfer molding using a thermosetting resin or by injection molding using a thermoplastic resin. Here, the sealing resin 12 is formed so as to seal the circuit board 16 and the electric circuit formed on the surface thereof, and the rear surface of the circuit board 16 is exposed from the sealing resin 12. Moreover, as a sealing method other than sealing by molding, well-known sealing methods such as sealing by potting and sealing by use of a case material, for example, can be applied. With reference to FIG. 1B, in order to suitably release heat to the outside, the heat being generated from the circuit element 14 mounted on the surface of the circuit board 16, the rear surface of the circuit board 16 is exposed to the outside of the sealing resin 12. Moreover, in order to improve moisture resistance of the entire device, it is also possible to seal the entire device including the rear surface of the circuit board 16 by use of the sealing resin 12.

With reference to the cross-sectional view of FIG. 1C, the connection part 25 will be described in detail. FIG. 1C is an enlarged cross-sectional view of the hybrid integrated circuit device 10, showing the connection part 25 and the vicinity thereof. The connection part 25 is a part which connects the laminated wiring layers 18 to each other through the insulating layer 17. Moreover, the connection part 25 can also be used as a thermal via for thermally connecting the wiring layers 18 to each other.

In this embodiment, the connection part 25 including the first connection part 25A and the second connection part 25B is formed. The first connection part 25A is a part protruded continuously from the first wiring layer 18A in its thickness direction. Here, the first connection part 25A is protruded upward and buried in the second insulating layer 17B. The second connection part 25B is a part protruded continuously from the second wiring layer 18B in its thickness direction. Here, the second connection part 25B is protruded downward and buried in the second insulating layer 17B.

The first connection part 25A is formed by etching processing so as to be protruded in the thickness direction, and is made of a Cu foil formed by plating or calendering. Moreover, the first connection part 25A can also be formed by use of a method other than etching processing. To be more specific, by depositing an electrolytic plated film or an electroless plated film so as to form a convex shape on the surface of the first wiring layer 18A, the first connection part 25A can be formed. Moreover, it is also possible to form the first connection part 25A by providing a conductive material such as a brazing material including solder and the like, and a silver paste on the surface of the first wiring layer 18A.

The second connection part 25B is a part formed by plating processing such as electrolytic plating and electroless plating. A method for forming the second connection part 25B will be described later in an embodiment for explaining a manufacturing method.

In this embodiment, a spot where the above-described first and second connection parts 25A and 25B come into contact with each other is positioned in an intermediate portion of the second insulating layer 17B in its thickness direction. Here, the intermediate portion means a portion that is above the upper surface of the first wiring layer 18A and is below the lower surface of the second wiring layer 18B. Therefore, although the spot where the first and second connection parts 25A and 25B come into contact with each other is around the center portion of the second insulating layer 17B in its thickness direction on the page space, the spot can be changed within a range of the intermediate portion described above. Considering the case where the second connection part 25B is formed by plating processing, the portion where the first and second connection parts 25A and 25B come into contact with each other is preferably disposed above an intermediate position between the upper surface of the first wiring layer and the lower surface of the second wiring layer. Thus, there is an advantage that formation of the second connection part 25B made of the plated film is facilitated. Specifically, as is made clear by the manufacturing method to be described later, a via is formed to form the second connection part, and a depth of this via can be reduced. Moreover, as the via is formed to be shallow, a diameter of the via can be reduced. Furthermore, as the diameter of the via is reduced, an interval is narrowed, and an entire minute pattern can be realized.

Moreover, the first wiring layer 18A can also be formed to be partially thick. Accordingly, the first wiring layer 18A which is formed to be thick can be used as a power electrode or wiring. In addition, it is possible to form a miniaturized wiring by use of the first wiring layer 18A in other regions which is thinly formed.

Figure 2A:
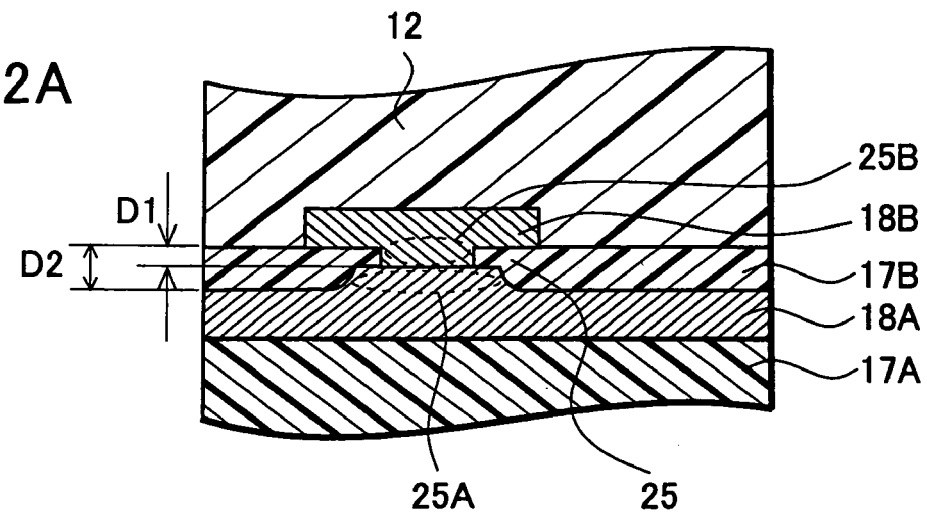
FIG. 2A is a cross-sectional view showing the hybrid integrated circuit device according to the embodiment of the invention.
Figure 2B:
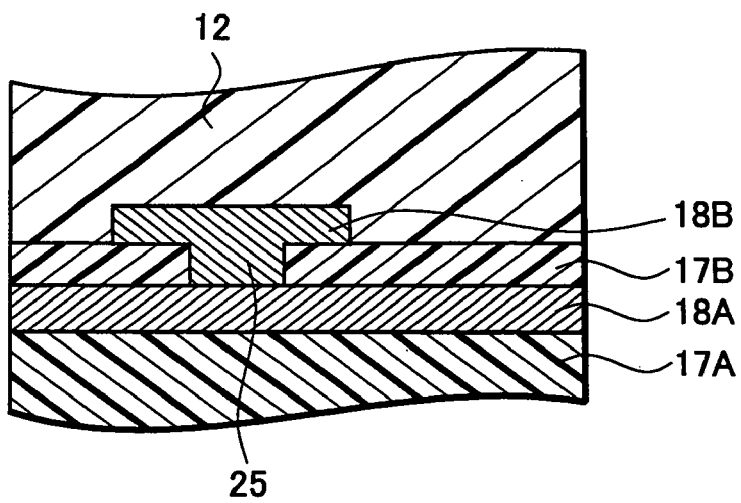
FIGS. 2B and 2C are cross-sectional views showing comparative examples.
Figure 2C:
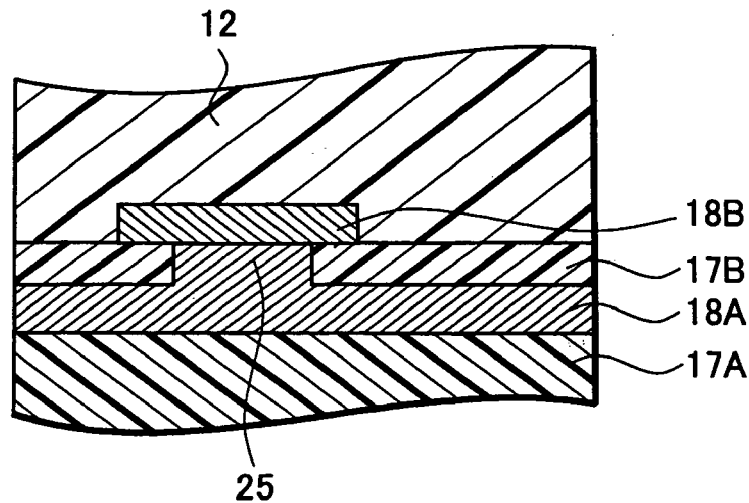

With reference to each cross-sectional view in FIGS. 2A to 2C, a description will be given of advantages obtained by the configuration of the connection part 25 described above. FIG. 2A shows a cross-sectional shape of the connection part 25 of this embodiment, and FIGS. 2B and 2C are cross-sectional views showing comparative examples to this embodiment.

With reference to FIG. 2A, the structure of the connection part 25 of this embodiment will be described in more detail. First, the first insulating layer 17A is provided in the lowest layer, and the first wiring layer 18A is patterned on the surface of the first insulating layer 17A. Thereafter, the second wiring layer 18B is laminated on the second insulating layer 17B. Moreover, the second wiring layer 18B is entirely covered with the sealing resin 12 which seals the entire device.

As described above, the connection part 25 is formed of the first connection part 25A and the second connection part 25B. In addition, the spot where the both parts come into contact with each other is positioned in the intermediate portion of the second insulating layer 17B in its thickness direction. A thickness (D2) of the second insulating layer 17B which covers the first wiring layer 18A is, for example, about 35 μm. A distance (D1) between the portion where the first and second connection parts 25A and 25B come into contact with each other and the upper surface of the second insulating layer 17B is, for example, about 15 μm. By use of the configuration described above, reliability of the connection part 25 for external force such as thermal stress can be improved.

Moreover, D1 is preferably not more than half D2. Accordingly, the second connection part 25B can be easily formed. Specifically, formation of a through-hole for forming the second connection part 25B, and formation of a plated film inside the through-hole are facilitated.

The thermal stress will be described. The thermal stress is considered to be increased on an interface between each member. To be more specific, the first wiring layer 18A, the second insulating layer 17B, and the sealing resin 12 have different thermal expansion coefficients. The sealing resin 12 and the second insulating layer 17B are both formed of a material mainly made of a resin. However, for the reason that amounts of inorganic fillers mixed therein are different from each other, and the like, the sealing resin 12 and the second insulating layer 17B have thermal expansion coefficients slightly different from each other. Thus, due to a temperature change in use, stresses are caused on an interface between the sealing resin 12 and the second insulating layer 17B and on an interface between the second insulating layer 17B and the first wiring layer 18A. To be short, one of the phenomena is slipping of the layers on each other. Therefore, according to the configuration of this embodiment, the portion where the first and second connection parts 25A and 25B come into contact with each other is positioned in the intermediate portion of the second insulating layer 17B. This can contribute to prevention of the slipping described above. In addition, reliability of the connection part 25B for the thermal stress can be improved.

With reference to FIG. 2B, a first comparative example will be described. Here, the connection part 25 integrated with the upper second wiring layer 18B is formed. A tip portion of the connection part 25, which is buried in the second insulating layer 17B, comes into contact with the surface of the first wiring layer 18A. According to this comparative example, the connection part 25 comes into contact with an interface between the first wiring layer 18A and the second insulating layer 17B. Therefore, an influence (for example, slipping) of a thermal stress, which is caused on the interface described above, on the portion with which the connection part 25 comes into contact is considered to be increased. Consequently, compared to the configuration of this embodiment, the configuration of the first comparative example has a lower reliability for the thermal stress.

With reference to FIG. 2C, a second comparative example will be described. In this comparative example, the connection part 25 integrated with the lower first wiring layer 18A is formed. Moreover, the upper end of the connection part 25 comes into contact with the lower surface of the second wiring layer 18B. As described above, it is considered that a large thermal stress is also caused on the interface between the second insulating layer 17B and the sealing resin 12. Therefore, the thermal stress acts on the portion where the connection part 25 and the second wiring layer 18B come into contact with each other. Thus, reliability of connection between the connection part 25 and the second wiring layer 18B is considered to be low. From comparison between the first and second comparative examples and the present application, it is found out that the reliability of the connection part 25 of the present application for the thermal stress is high.

Figure 3:
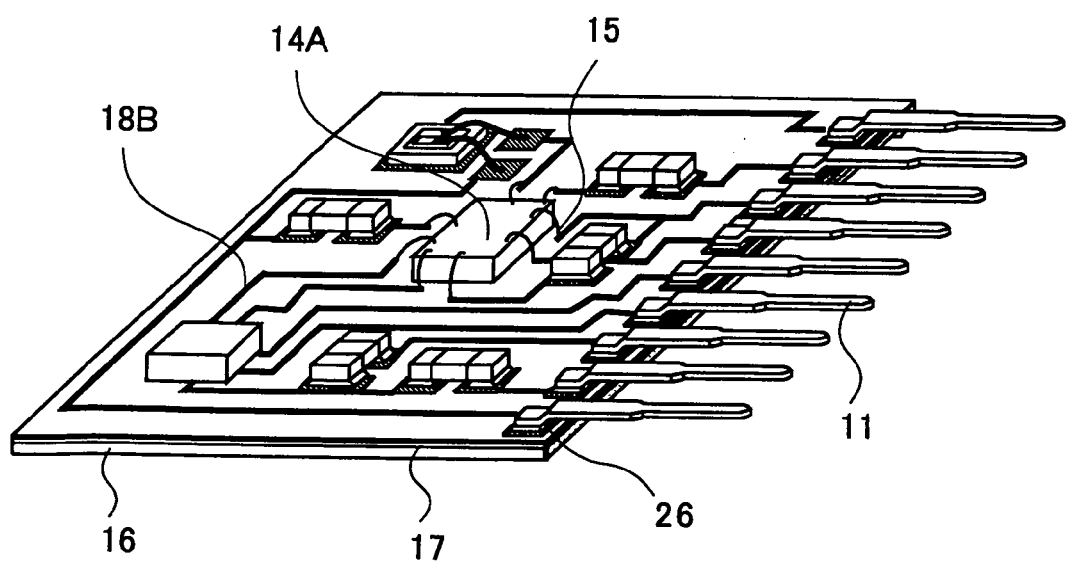
FIG. 3 is a perspective view showing the hybrid integrated circuit device according to the embodiment of the invention.

With reference to a perspective view of FIG. 3, a description will be given of an example of a specific shape of the second wiring layer 18B formed on the surface of the circuit board 16. In FIG. 3, the resin for sealing the entire device is omitted.

With reference to FIG. 3, the second wiring layer 18B forms bonding pads on which the circuit elements 14 are mounted, pads 26 to which the leads 11 are fixed, and the like. Moreover, around the semiconductor element 14A, a number of pads are formed, to which the thin metal wires 15 are wire-bonded. In the case where the semiconductor element 14A having a number of bonding pads is mounted, a wiring density is limited in a single layer pattern including the second wiring layer 18B alone. Thus, the pattern may not be sufficiently extended. In this embodiment, by constructing a multilayer wiring structure on the surface of the circuit board 16, a complex pattern extension is realized.

Figure 4A:
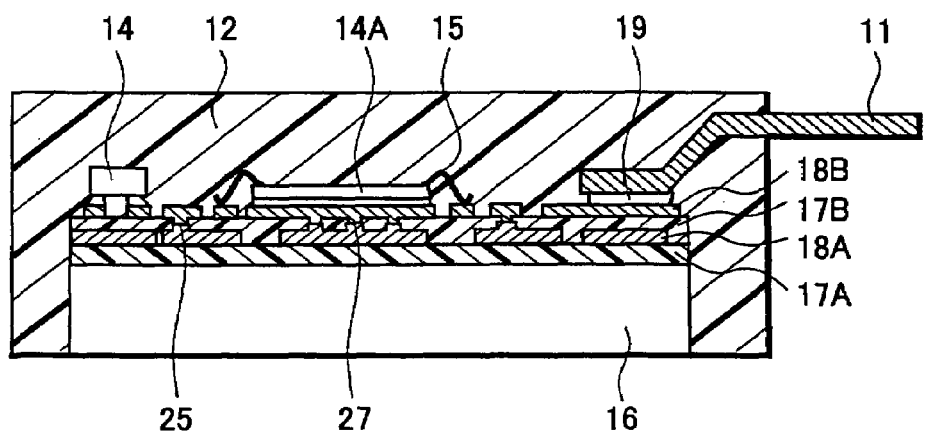
FIGS. 4A and 4B are cross-sectional views showing the hybrid integrated circuit device according to the embodiment of the invention.
Figure 4B:
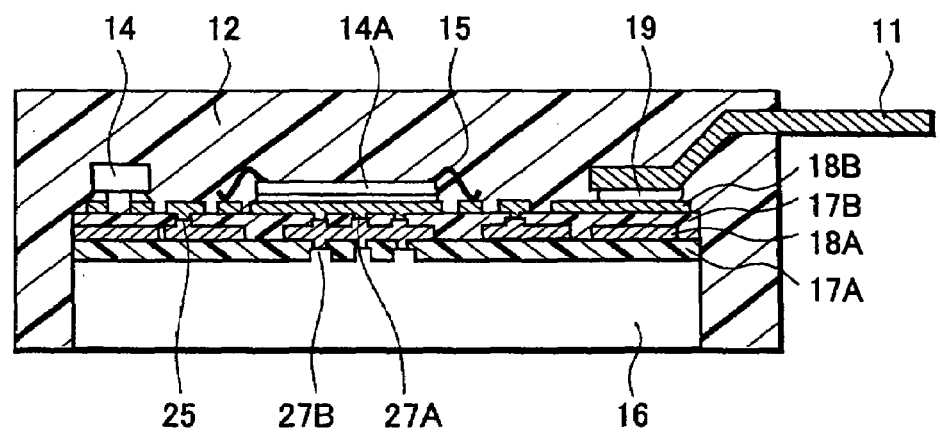

With reference to FIGS. 4A and 4B, configurations of hybrid integrated circuit devices of other modes will be described. FIGS. 4A and 4B are cross-sectional views of the hybrid integrated circuit devices of the other modes.

With reference to FIG. 4A, here, a thermal via 27 is formed so as to penetrate the second insulating layer 17B. The thermal via 27 is a part formed by filling a hole penetrating the second insulating layer 17B with metal, and functions as a path of heat to the outside. Therefore, the thermal via 27 may not function as an electrical path.

In the case where the rear surface of the chip mounted above the thermal via is connected with the ground potential, the rear surface of the chip may be connected with the thermal via by conductive adhesive.

To be more specific, the thermal via 27 is formed so as to come into contact with the lower surface of the land-shaped second wiring layer 18B to which the semiconductor element 14A is fixed. Therefore, even if a large amount of heat is generated from the semiconductor element 14A, the heat is transmitted to the circuit board 16 through a plurality of thermal vias 27. In this case, a path of the heat is from the semiconductor element 14A to the outside through the second wiring layer 18B, the thermal via 27, the first insulating layer 17A, and the circuit board 16. Here, the thermal via 27 is formed of the first and second connection parts 25A and 25B described above. In addition, a portion where the first and second connection parts 25A and 25B come into contact with each other is an intermediate portion of the insulating layer in its thickness direction. The thermal via 27 functions as the path of heat, and is a part on which a large thermal stress is expected to act. Thus, the configuration of this mode is significant.

With reference to FIG. 4B, here, the thermal vias 27 are provided in both of the first insulating layer 17A and the second insulating layer 17B. As described above, the first insulating layer 17A containing a large amount of fillers has excellent heat release properties. Therefore, by providing the thermal via 27 in the first insulating layer 17A as shown in FIG. 4B, the heat release properties can be further improved. The thermal via 27 provided in the first insulating layer 17A may also be provided in a region corresponding to the lower side of the semiconductor element 14A which generates heat.

In the case where the thermal via 27 is formed between the circuit board 16 and the first insulating layer 17A as described above, the first connection part 27A protruded in a convex shape is formed on the surface of the circuit board 16. Moreover, the second connection part 25B is provided on the rear surface of the first wiring layer 18A. Accordingly, the first and second connection parts 25A and 25B are allowed to come into contact with each other in an intermediate portion of the first insulating layer 17A.

Figure 5A:
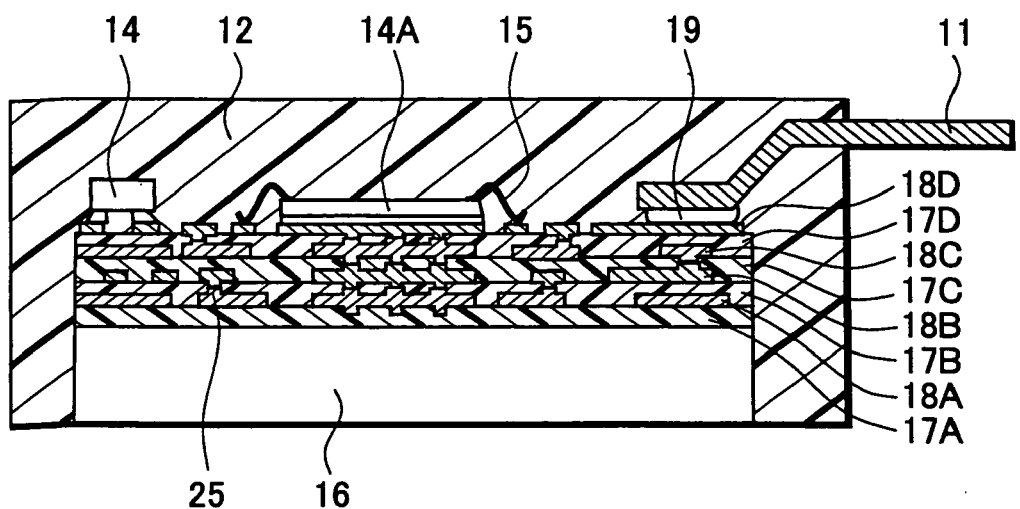
FIGS. 5A and 5B are cross-sectional views showing the hybrid integrated circuit device according to the embodiment of the invention.
Figure 5B:
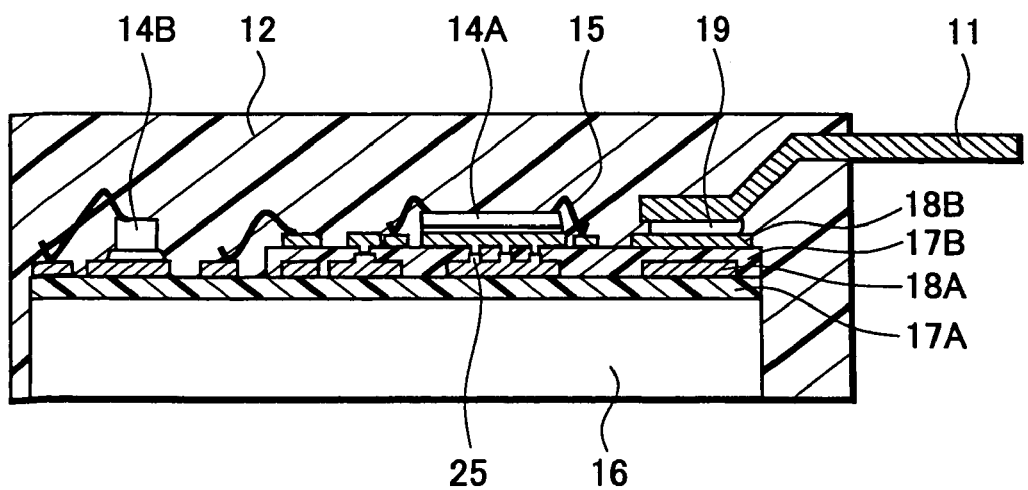

With reference to FIGS. 5A and 5B, a description will be given of structures of hybrid integrated circuit devices of still other modes. FIGS. 5A and 5B are cross-sectional views of the hybrid integrated circuit devices.

With reference to FIG. 5A, here, a four-layer wiring structure is formed by laminating wiring layers 18 with insulating layers 17 interposed therebetween. To be more specific, a first wiring layer 18A is formed on the upper surface of a first insulating layer 17A. Thereafter, second to fourth wiring layers 18B to 18D are laminated with second to fourth insulating layers 17B to 17D interposed therebetween. As described above, by increasing the number of the wiring layers 18, a wiring density can be improved. In the second to fourth insulating layers 17B to 17D, connection parts 25 are formed to connect the respective wiring layers to each other.

With reference to FIG. 5B, here, a multilayer wiring structure is formed on the surface of a circuit board 16 in a region where a semiconductor element 14A having a number of pads is mounted. Meanwhile, a single-layer wiring structure is formed on the surface of the circuit board 16 in a region where a circuit element 14B is fixed.

The semiconductor element 14A is an element having several dozen to several hundred electrodes as described above. Therefore, in order to extend a pattern which is connected to the electrodes of the semiconductor element 14A, the multilayer wiring structure is formed around the semiconductor element 14A. To be more specific, a multilayer wiring structure including first and second wiring layers 18A and 18B is formed.

Moreover, the second wiring layer 18B formed to have a multilayer structure and the first wiring layer 18A formed to have a single-layer structure are electrically connected to each other with thin metal wires 15.

The circuit element 14B is, for example, a power semiconductor element, and is a switching element which generates a large amount of heat. A region of the circuit board 16 where the single-layer wiring structure including the first wiring layer 18A is formed has a heat release effect larger than other regions. Therefore, a discrete transistor which has a large calorific value such as the circuit element 14B may be directly fixed to the first wiring layer 18A which forms the single-layer wiring.

Figure 6A:
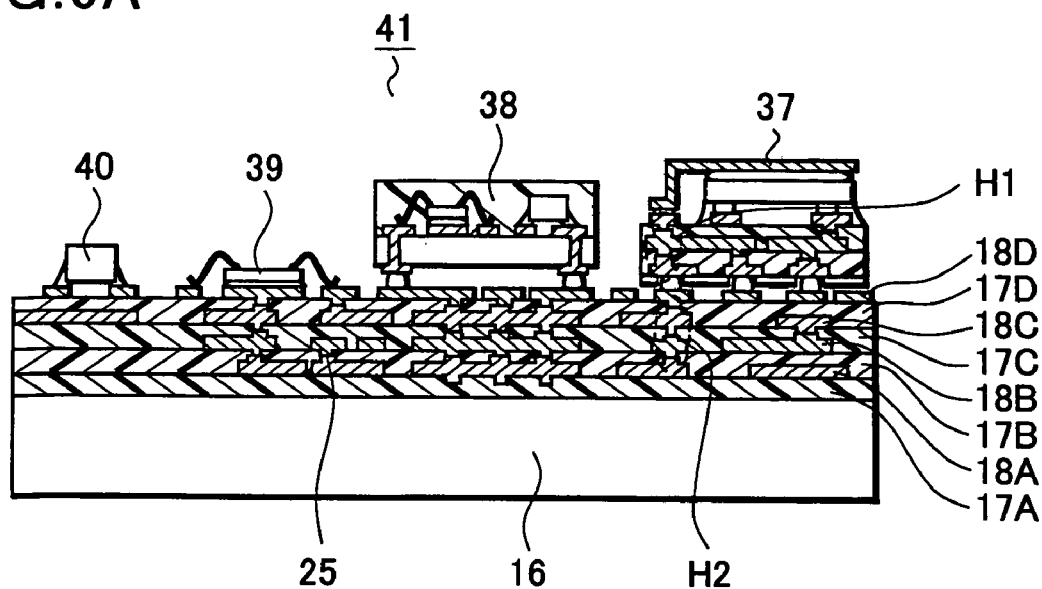
FIGS. 6A and 6B are cross-sectional views showing the hybrid integrated circuit device according to the embodiment of the invention.
Figure 6B:
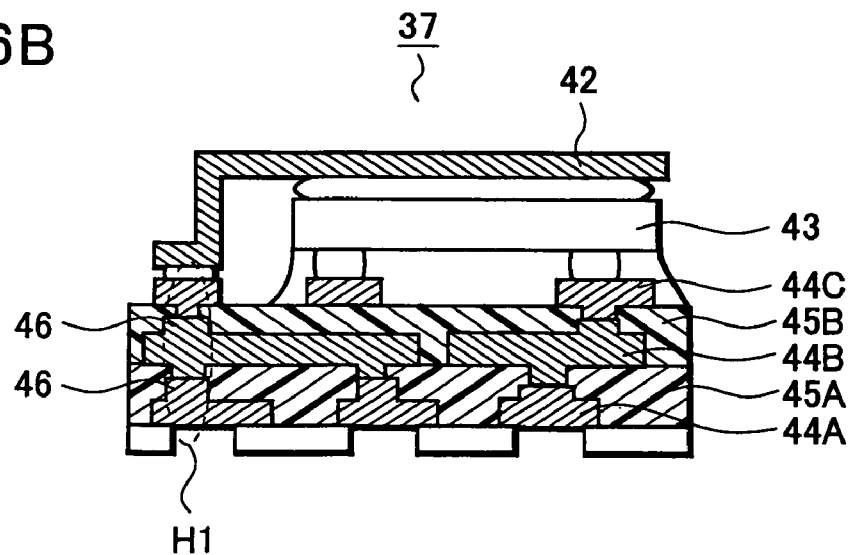

With reference to FIGS. 6A and 6B, a description will be given of a configuration of a circuit module 41 of still another mode. FIG. 6A is a cross-sectional view showing the configuration of the circuit module 41, and FIG. 6B is a cross-sectional view of a first circuit device 37 which forms a part of the circuit module 41.

With reference to FIG. 6A, a multilayer wiring structure is formed on the surface of a circuit board 16. Here, a four-layer wiring structure is formed, which includes first to fourth wiring layers 18A to 18D. On the uppermost fourth wiring layer 18D, a plurality of circuit elements are mounted. Here, two circuit devices are fixed. Moreover, first and second circuit elements 39 and 40 which are bare transistor chips are mounted on the uppermost fourth wiring layer 18D.

The first circuit device 37 is a circuit device having one semiconductor chip, in which multiple layers of wirings are formed on a supporting board. The structure of the first circuit device 37 will be described in detail later with reference to FIG. 6B. Meanwhile, a second circuit device 38 is a system in package (SIP) in which a system is constructed by including a semiconductor element and a passive element. Although, here, FIG. 6A shows a package realized by planarly disposing circuit elements, the package may have a stack structure. As the circuit elements included in the first circuit device 37 or the second circuit device 38, active elements or passive elements can be generally employed as in the case of the circuit elements described with reference to FIGS. 1A to 1C. Moreover, as the first and second circuit elements 39 and 40 which are directly fixed to the fourth wiring layer 18D, active elements or passive elements can be generally employed as in the case of the circuit elements described with reference to FIGS. 1A to 1C.

With reference to FIG. 6B, the first circuit device 37 will be described in detail. In the first circuit device 37, a semiconductor element is flip-chip mounted on a board formed to have a multilayer structure.

Here, a multilayer wiring structure is formed of first to third wiring layers 44A to 44C. Therefore, even if a semiconductor element 43 is an LSI element having a number of pads, wiring extension can be performed from those pads. Moreover, the semiconductor element 43 is a flip-chip mounted LSI element, which is fixed to the third wiring layer 44C by use of a brazing material such as solder.

One side of a connection plate 42 is fixed to the rear surface (the upper surface on the page space) of the semiconductor element 43 by use of an adhesive. The other side of the connection plate 42 is fixed to the wiring layer 44C. The connection plate 42 functions as a path for releasing heat generated from the semiconductor element 43. Therefore, the heat generated from the semiconductor element 43 is transmitted to the third wiring layer 44C through the connection plate 42. Moreover, the third wiring layer 44C to which the connection plate 42 is connected, and the second and first wiring layers 44B and 44A therebelow are connected to each other through connection parts 46. Therefore, the connection parts 46 form a path H1 for transmitting heat in a thickness direction of the board. The path functions as a path of heat. Moreover, if the rear surface of the semiconductor element 43 is connected to a ground potential, the path also has a function as a path connected to the ground potential.

Furthermore, with reference to FIG. 6A, the first wiring layer 44A positioned in the lowest portion of the path H1 is connected to the fourth wiring layer 18D, which is laminated on the surface of the circuit board 16, by use of a brazing material. Moreover, below the path H1, a path H2 is formed, which includes each wiring layer connected through connection parts 25. The path H2 is a path for transmitting heat generated from the first circuit device 37 to the circuit board 16. With the configuration described above, the heat generated from the semiconductor element included in the first circuit device 37 is transmitted to the circuit board 16 through the first path H1 formed inside the first circuit device 37 and through the second path H2 formed on the surface of the circuit board 16. Accordingly, the heat is released to the outside. Thus, the circuit module 41 has the configuration excellent in the heat release properties.

Second Embodiment

In this embodiment, a description will be given of a method for manufacturing a hybrid integrated circuit device as an example of a circuit device. However, the following manufacturing method of this embodiment is also applicable to methods for manufacturing other types of circuit devices.

Figure 7A:
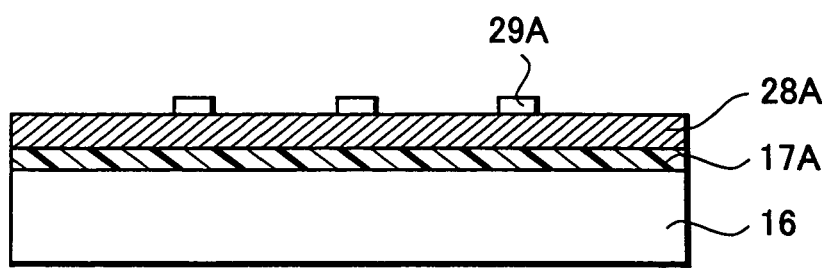
FIGS. 7A to 7C are cross-sectional views showing a method for manufacturing a hybrid integrated circuit device according to the embodiment of the invention.

First, with reference to FIG. 7A, a first insulating layer 17A is applied onto the surface of a circuit board 16, and a first conductive film 28A is laminated thereon. As the circuit board 16, a metal plate having a thickness of about 1.5 mm can be used. Moreover, as the first conductive film 28A, a material mainly made of copper or a material mainly made of Fe—Ni or Al can be used. For a thickness of the first conductive film 28A, not less than a thickness obtained by adding a thickness of a first wiring layer 18A to be formed and a height of a first connection part 25A is required. To be more specific, the thickness of the first conductive film 28A is, for example, about 20 µm to 150 µm. A resist 29A covers the surface of the first conductive film 28A in a region where the first connection part 25A will be formed. In a state where the resist 29A covers the surface, etching is performed. Moreover, as the first insulating layer 17A, one obtained by mixing inorganic fillers in an insulating resin such as an epoxy resin can be used. Here, as the inorganic fillers to be mixed in, $SiO_2$, $Al_2O_3$, SiC, AlN, or the like can be used.

Figure 7B:
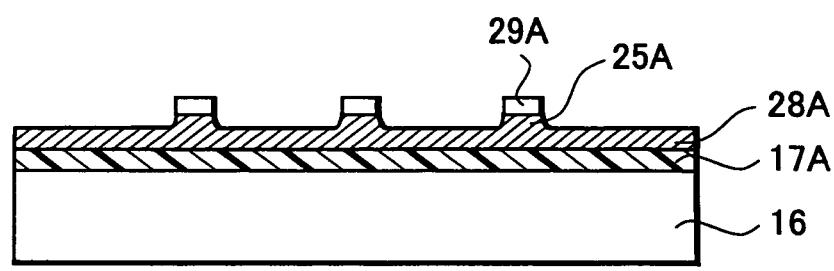
Figure 7C:
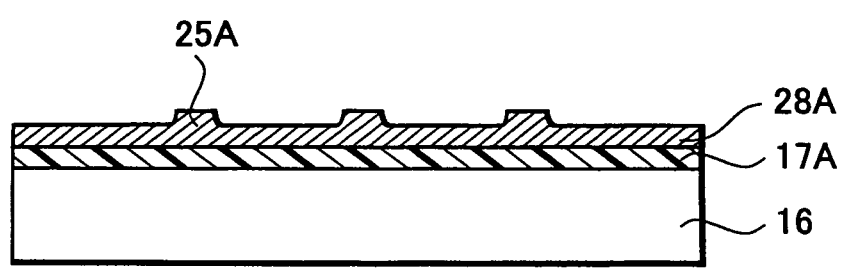

FIG. 7B shows a cross section in a state after etching is performed. Here, the region covered with the resist 29A is protruded in a convex shape. The portion protruded in the convex shape forms the first connection part 25A. The first conductive film 28A in the region where etching is performed with the surface exposed is formed to be uniformly thin. After this step is finished, the resist 29A is removed. Here, a height of protrusion of the first connection part 25A is adjusted to about several ten µm. FIG. 7C shows the first connection part 25A in the state where the resist 29A is removed.

Next, with reference to FIGS. 8A to 8C, a description will be given of another method for forming the first connection part 25A on the surface of the first conductive film 28A.

Here, the first connection part 25A is formed by selectively forming a plated film on the surface of the first conductive film 28A.

Figure 8A:
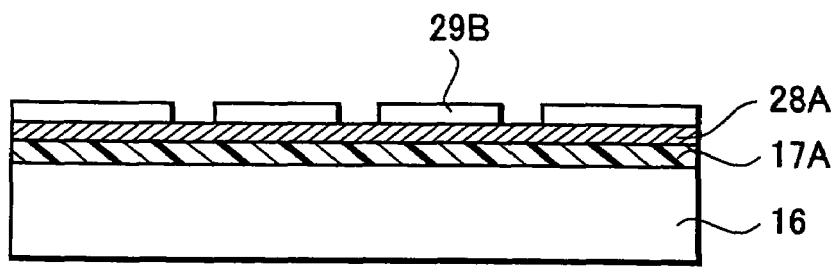
FIGS. 8A to 8C are cross-sectional views showing the method for manufacturing a hybrid integrated circuit device according to the embodiment of the invention.

With reference to FIG. 8A, first, a resist 29B is selectively formed on the surface of the first conductive film 28A. To be more specific, the resist 29B is formed on the surface except for a region where the first connection part 25A will be formed.

Figure 8B:
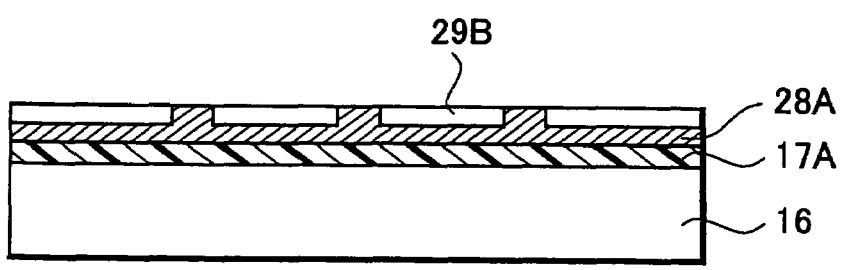
Figure 8C:
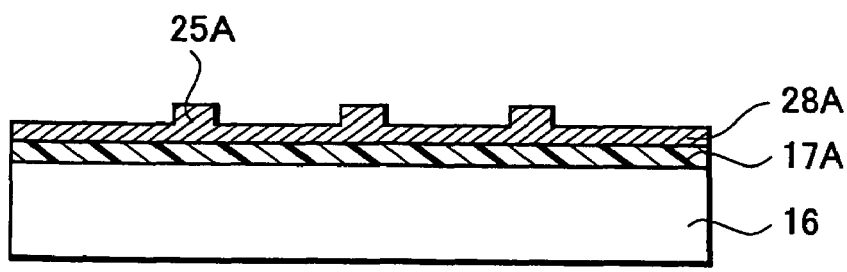

Next, with reference to FIG. 8B, a plated film is grown on the surface of the first conductive film 28A which is selectively exposed from the resist 29B. For formation of the plated film, electrolytic plating, electroless plating or a method combining the both can be adopted. After this step is finished, the resist 29B is removed, and the first connection part 25A having a convex shape as shown in FIG. 8C is obtained.

Figure 9A:
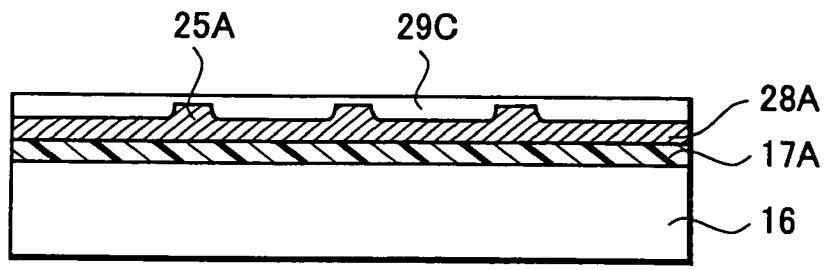
FIGS. 9A to 9D are cross-sectional views showing the method for manufacturing a hybrid integrated circuit device according to the embodiment of the invention.
Figure 9B:
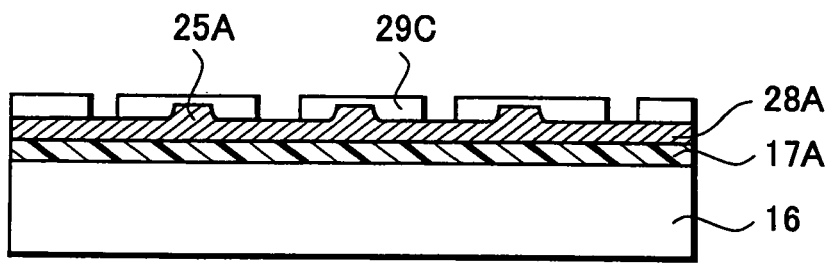
Figure 9C:
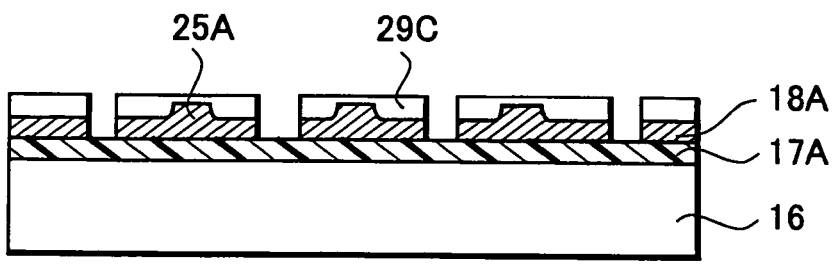

With reference to FIGS. 9A to 9C, next, the first conductive film 28A including the upper surface of the first connection part 25A is covered with a resist 29C. Moreover, after patterning the resist 29C along the first wiring layer 18A to be formed, etching is performed. Thus, the first wiring layer 18A is patterned. After etching of the first wiring layer 18A is finished, the resist 29C is removed.

Figure 9D:
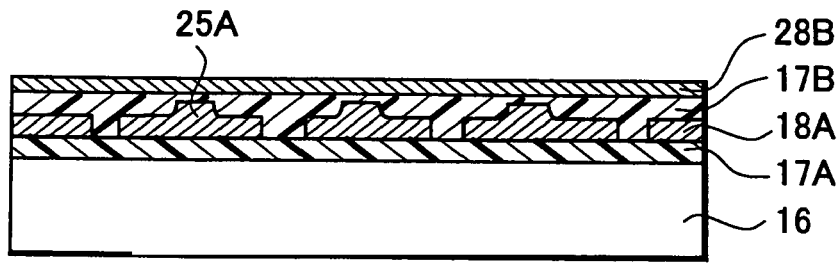

With reference to FIG. 9D, next, a second conductive film 28B is laminated on a second insulating layer 17B which covers the first wiring layer 18A. As a method for laminating the second conductive film 28B, there are considered the following three methods. Specifically, in the first method, after the second insulating layer 17B is formed so as to cover the first wiring layer 18A, the second conductive film 28B made of a plated film is formed on the surface of the second insulating layer 17B. In the second method, after the second insulating layer 17B is formed, the second conductive film 28B made of a rolled copper foil or the like is pressure-bonded to the second insulating layer 17B. According to the second method, adhesion strength between the second insulating layer 17B and the second conductive film 28B is improved. In the third method, the second conductive film 28B having the second insulating layer 17B attached to its rear surface is laminated so as to cover the first wiring layer 18A. According to the third method, adhesion strength between the second insulating layer 17B and the second conductive film 28B is also improved. Moreover, a side of the first connection part 25A is formed into a taper shape. Thus, there is an advantage that the first connection part 25A is easily buried in the second insulating layer 17B.

With reference to FIGS. 10A to 10D, next, a through-hole 32 is formed by partially removing the second insulating layer 17B and the second conductive film 28B from the portion where a connection part 25 is formed. First; with reference to FIG. 10A, the second conductive film 28B corresponding to a region where the through-hole 32 will be formed is partially removed. To be more specific, after a resist 29D is formed on the surface of the second conductive film 28B except for the region where the through-hole 32 will be formed, etching is performed. Thus, the second conductive film 28B is partially removed, and the through-hole 32 is formed. Moreover, the through-hole 32 is deepened by removing the second insulating layer 17B therebelow. The surface of the first wiring layer 18A is exposed in the lower side of the through-hole 32. Here, the upper surface of the first connection part 25A provided in the first wiring layer 18A is exposed in the lower side of the through-hole 32.

Figure 10A:
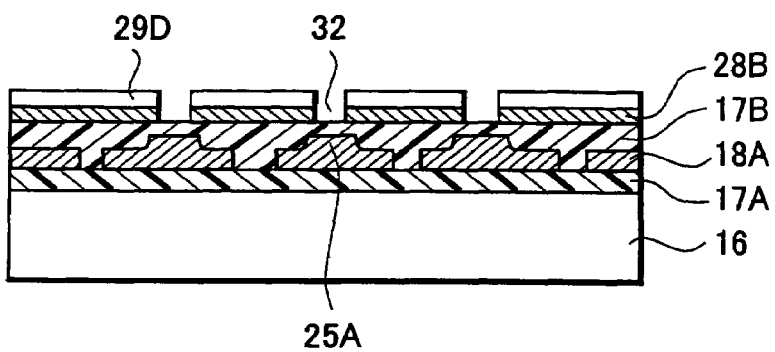
FIGS. 10A to 10D are cross-sectional views showing the method for manufacturing a hybrid integrated circuit device according to the embodiment of the invention.
Figure 10B:
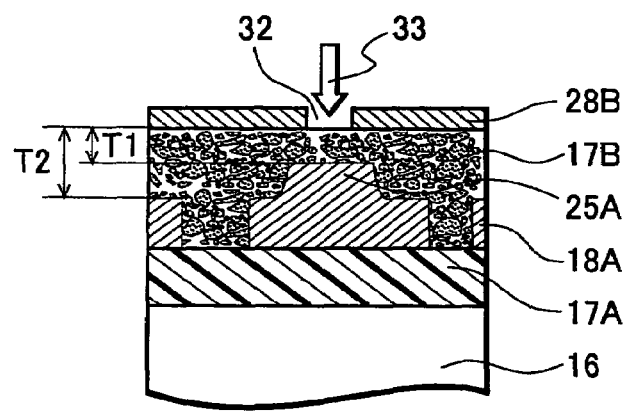

With reference to FIG. 10B, a method for forming the through-hole 32 will be described in more detail. In this embodiment, the second insulating layer 17B in the lower side of the through-hole 32 is thinned by burying the first connection part 25A. Accordingly, the second insulating layer 17B in a thinned region is removed by use of a laser and the like. Thus, the first connection part 25A is exposed in the lower part of the through-hole 32. In most regions, a thickness T2 of the second insulating layer 17B is, for example, about 50 µm. Meanwhile, a thickness of the second insulating layer 17B in the region corresponding to the lower side of the through-hole 32 is, for example, as thin as about 10 µm to 25 µm.

Therefore, if it is assumed that the through-hole 32 having the same aspect ratio is formed by use of the laser, it is possible to form the through-hole 32 having a small diameter according to this embodiment. Under the conditions as described above, the diameter of the through-hole 32 can be reduced to about half. Thus, an area occupied by the through-hole 32 can be reduced to about a quarter. This contributes to miniaturization of the entire device. Moreover, since the inorganic fillers are mixed in the second insulating layer 17B in order to secure the heat release properties, formation of the through-hole 32 by use of the laser is in a somewhat difficult situation. In order to form the through-hole 32 in such a situation, it is significant to reduce the thickness of the second insulating layer 17B in the region where the through-hole 32 is formed.

Figure 10C:
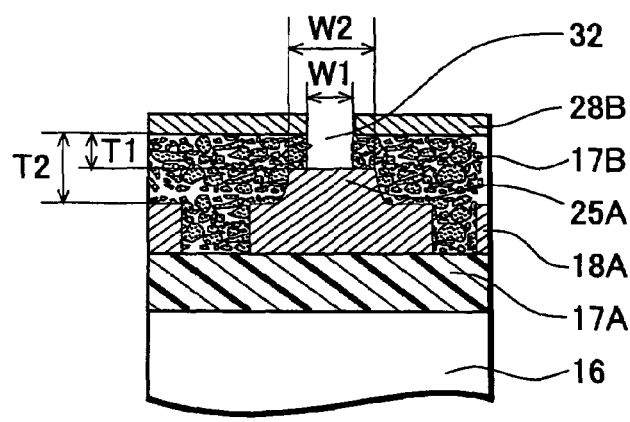

FIG. 10C shows a cross section after the through-hole 32 is formed by use of the foregoing method. From the bottom of each of the through-holes 32, the upper surface of the first connection part 25A is exposed. From the sidewall of the through-hole 32 formed by laser processing, the fillers mixed in the second insulating layer 17B are exposed. In the second insulating layer 17B of this embodiment, fillers having a large diameter are mixed for improvement in the heat release properties. Therefore, the sidewall of the through-hole 32 has irregularities. As these fillers, $Al_2O_3$, AlN or the like is typically used. Note that, if a residue remains in the bottom of the through-hole 32 after the laser processing described above, cleaning for removing this residue is performed.

A planar size of the first connection part 25A is set to be larger than that of the through-hole 32 formed thereabove. In other words, since planar shapes of the through-hole 32 and the first connection part 25A are circles, the diameter of the first connection part 25A is set to be larger than that of the through-hole 32. For example, if a diameter W1 of the through-hole 32 is about 100 µm, a diameter W2 of the first connection part 25A is about 150 µm to 200 µm. Moreover, if the diameter W1 of the through-hole 32 is about 30 µm to 50 µm, the diameter W2 of the first connection part 25A is adjusted to about 50 µm to 70 µm. As described above, the planar size of the first connection part 25A is set to be larger than that of the through-hole 32. Accordingly, even if the through-hole 32 is formed with some positional shift, the through-hole 32 can be positioned above the first connection part 25A. Therefore, it is possible to prevent the lowering of connection reliability attributable to the positional shift described above. Moreover, as the planar shape of the first connection part 25A, shapes other than the circle can be adopted.

Figure 10D:
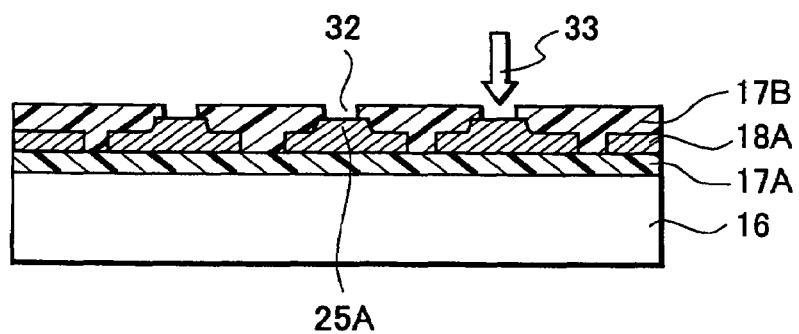

With reference to FIG. 10D, a description will be given of another method for forming the through-hole 32. In the above description, the through-hole 32 is formed after the second insulating layer 17B is covered with the second conductive film 28B. However, the through-hole 32 can also be formed by use of the method. To be more specific, by removing the second insulating layer 17B before the layer is covered with the second conductive film 28B, the upper surface of the first connection part 25A can be exposed from the lower part of the through-hole 32.

It is said that, if the through-hole shown in FIG. 10A is substantially 10 micrometers or less, a resin cannot be scattered by use of a carbon dioxide gas laser due to its wavelength. Instead of the carbon dioxide gas laser, a YAG laser is conceivable. However, in this case, there is a problem that Cu is scattered. Accordingly, the through-hole 32 may be formed by scattering an insulating resin directly by use of the YAG laser without providing the second conductive film 28B. A depth by which abrasion can be performed is smaller than a spot diameter of the laser. Thus, since there is provided the first connection part 25A, the depth by which abrasion is performed can be reduced, and the number of pulses can be reduced.

Moreover, isotropic wet etching may be performed instead of using the laser. In this case, as is generally known, the height of the first connection part 25A, that is, the thickness of the second insulating layer 17B affects an opening diameter. Thus, the fact that the second insulating layer 17B can be thinned leads to an advantage that the opening diameter can be reduced. Moreover, dry etching that is a well-known semiconductor technology may be performed. In this case, since an opening depth is shallow, etching time can be shortened.

Furthermore, in order to perform plating processing in the next step, zincate processing is performed as preparation. Here, zincate processing means processing for facilitating plating processing by performing electroless plating using an alkaline solution containing Zn ions.

With reference to FIGS. 11 and 12, next, a description will be given of a step of forming a second connection part 25B by forming a plated film in the through-hole 32 and of connecting the first wiring layer 18A and the second conductive film 28B. There are considered two methods for forming the plated film. The first method is a method for forming a plated film by electroless plating and, thereafter, forming a plated film again by electrolytic plating. The second method is a method for forming a plated film only by electrolytic plating.

Figure 11A:
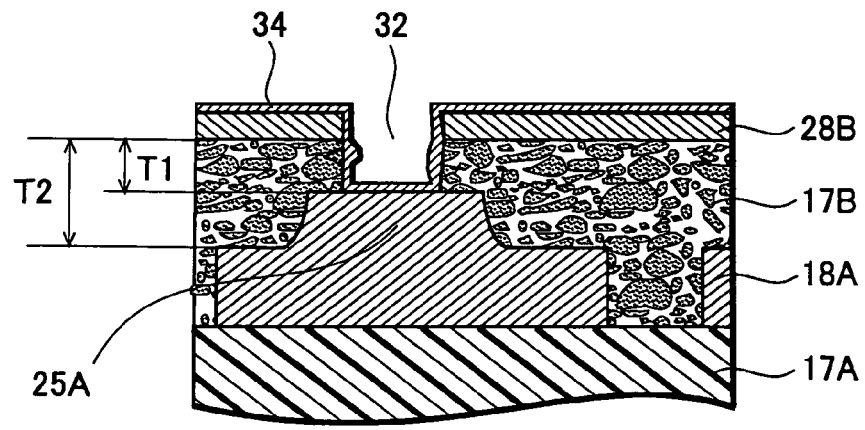
FIGS. 11A to 11C are cross-sectional views showing the method for manufacturing a hybrid integrated circuit device according to the embodiment of the invention.

With reference to FIGS. 11A to 1C, the foregoing first method for forming a plated film will be described. First, with reference to FIG. 11A, a plated film 34 is formed by electroless plating on the surface of the second conductive film 28B including the sidewall of the through-hole 32. A thickness of the plated film 34 may be about 3 µm to 5 µm.

Figure 11B:
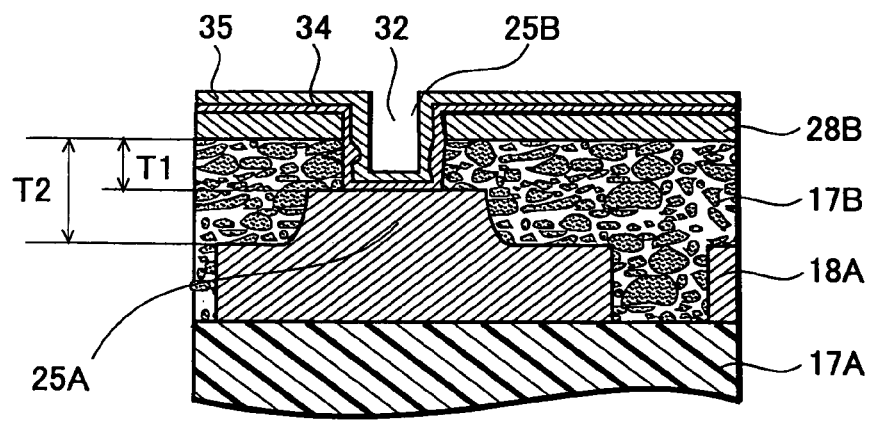

Next, with reference to FIG. 11B, a new plated film 35 is formed on the upper surface of the plated film 34 by electrolytic plating. To be more specific, by use of the second conductive film 28B having the plated film 34 formed thereon as a cathode electrode, the plated film 35 is formed by electrolytic plating. By the electroless plating described above, the plated film 34 is formed on the inner wall of the through-hole 32. Therefore, the plated film 35 formed here is formed to have a uniform thickness including the inner wall of the through-hole 32. Thus, the second connection part 25B formed of the plated film is formed. Specifically, a thickness of the plated film 35 is, for example, about 20 µm. As a material of the plated films 34 and 35 described above, copper that is the same material as that of the second conductive film 28B can be used. Moreover, metal other than copper can be used as the material of the plated films 34 and 35.

Figure 11C:
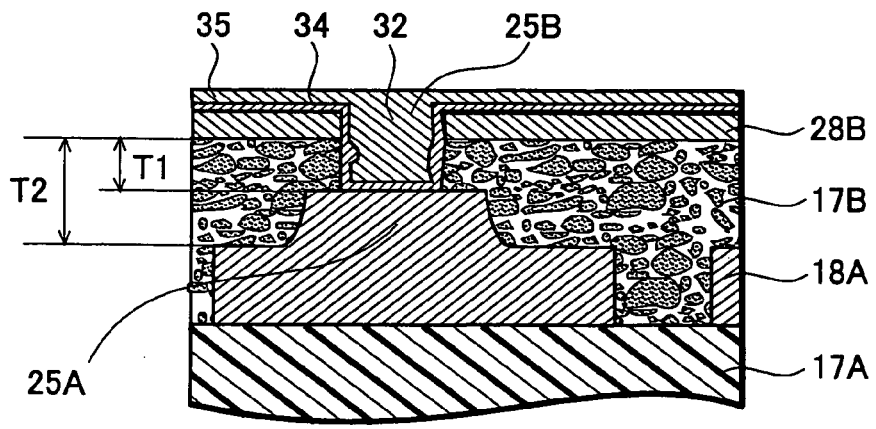

With reference to FIG. 11C, here, filling plating is performed to fill the through-hole 32 with the plated film 35. By performing the filling plating, the mechanical strength of the second connection part 25B can be improved.

Next, with reference to FIGS. 12A and 12B, a description will be given of a method for forming the second connection part 25B by electrolytic plating.

Figure 12A:
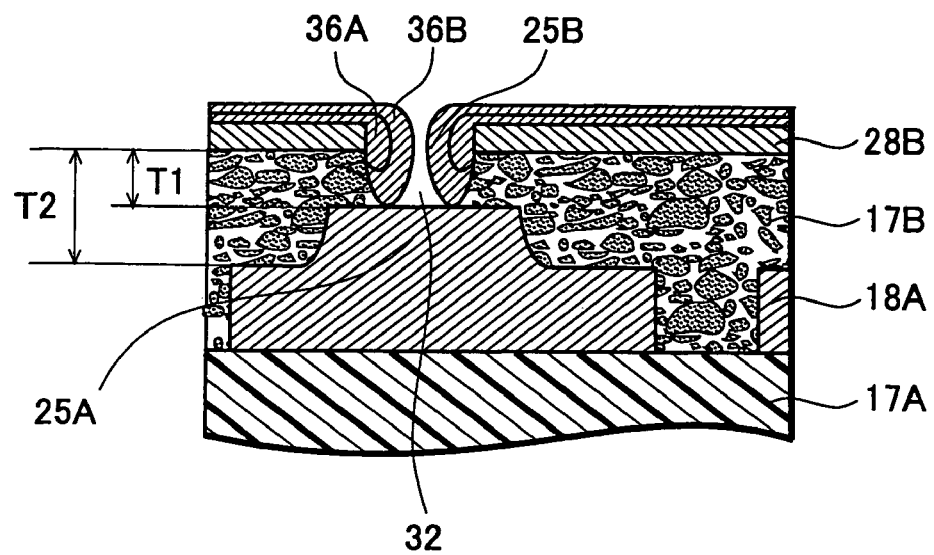
FIGS. 12A and 12B are cross-sectional views showing the method for manufacturing a hybrid integrated circuit device according to the embodiment of the invention.

With reference to FIG. 12A, first, a solution containing metal ions is allowed to come into contact with the through-hole 32. Here, as a material of a plated film, copper, gold, silver, palladium or the like can be used. When a current is allowed to flow by use of the second conductive film 28B as the cathode electrode, metal is deposited on the second conductive film 28B that is the cathode electrode, and a plated film is formed. Here, reference numerals 36A and 36B indicate a state where the plated film is grown. By electrolytic plating, a plated film is preferentially formed in a spot with a strong electric field. In this embodiment, this electric field becomes stronger in the second conductive film 28B in portions facing a peripheral portion of the through-hole 32. Therefore, as shown in FIG. 12A, the plated film is preferentially grown from the second conductive film 28B in portions facing the peripheral portion of the through-hole 32. At the point when the formed plated film comes into contact with the first connection part 25A, the first wiring layer 18A and the second conductive film 28B are connected to each other. Thereafter, a plated film is formed uniformly inside the through-hole 32. Thus, inside the through-hole 32, the second connection part 25B integrated with the second conductive film 28B is formed.

Figure 12B:
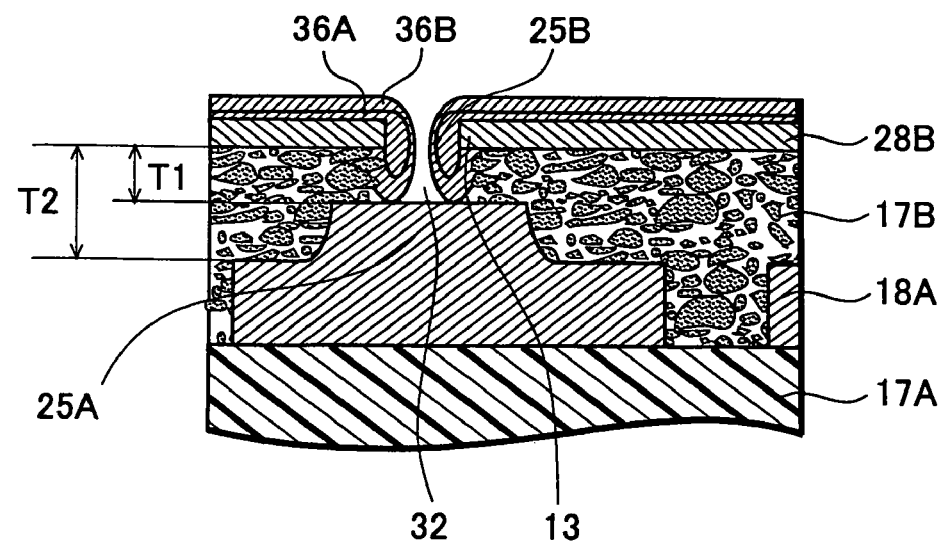

With reference to FIG. 12B, next, a description will be given of another method for forming the second connection part 25B. Here, a canopy top 13 is provided in a peripheral portion of the through-hole 32. Thus, the second connection part 25B is easily formed by electrolytic plating. Here, the "canopy top" means a part which is formed of the second conductive film 28B and is protruded so as to cover the peripheral portion of the through-hole 32. A specific method for forming the canopy top 13 can be performed by increasing output of a laser when the through-hole 32 is formed by use of the laser. By increasing the output of the laser, removal of the second insulating layer 17B by use of the laser is advanced horizontally, and the resin below the canopy top 13 is removed. Under the conditions described above, electrolytic plating is performed by use of the second conductive film 28B as the cathode electrode. Accordingly, the plated film is grown preferentially from the canopy top 13. Since the plated film is grown from the canopy top 13, the plated film can be grown preferentially downward compared to the case of FIG. 12A. Therefore, it is possible to surely fill the through-hole 32 with the plated film.

As described above, the sidewall of the through-hole 32 of this embodiment has irregularities. Moreover, the inorganic fillers mixed in the second insulating layer 17B are exposed on the sidewall of the through-hole 32. Accordingly, it is difficult to form a plated film on the sidewall of the through-hole 32. Generally, a plated film is hardly attached to the surface of inorganic fillers. Particularly, if AlN is exposed on the sidewall of the through-hole 32, it is difficult to form a plated film. Thus, in this embodiment, the second connection part 25B is formed by use of a method using the electrolytic plating described above.

Furthermore, in this embodiment, by forming a plated film in the through-hole 32, a plated film is inevitably formed on the surface of the second conductive film 28B, and a thickness thereof is increased. However, in this embodiment, since the plated film is formed in the through-hole 32 which is as shallow as about 10 µm as described above, a total thickness of the plated films formed can be reduced. Therefore, since there is a small increase in the thickness of the second conductive film 28B due to adhesion of the plated film, the second conductive film 28B can be maintained to be thin. Thus, a second wiring layer 18B formed of the second conductive film 28B can be made minute.

Furthermore, also in the case where the through-hole 32 is filled up by filling plating, since the through-hole 32 is formed to be shallow as described above, filling plating can be easily performed.

Figure 13A:
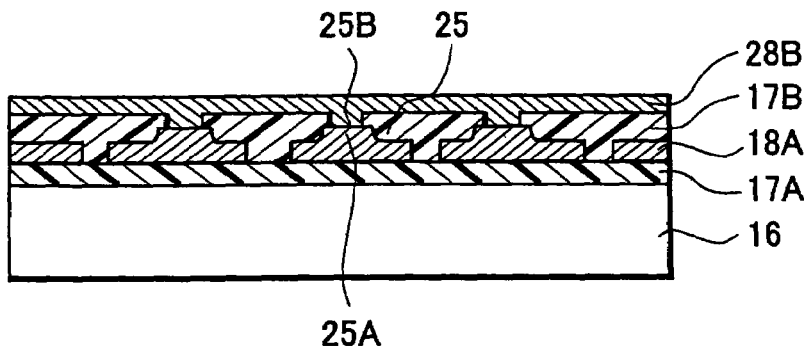
FIGS. 13A to 13C are cross-sectional views showing the method for manufacturing a hybrid integrated circuit device according to the embodiment of the invention.
Figure 13B:
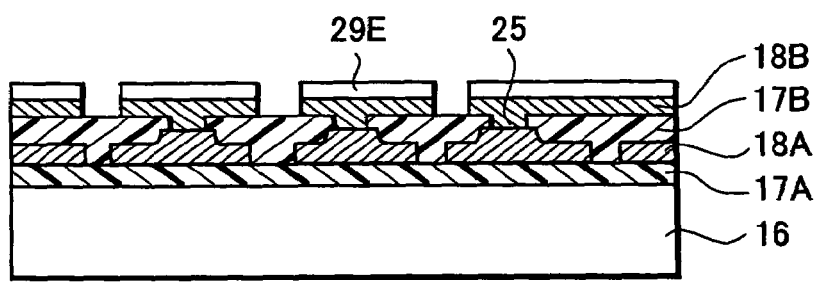
Figure 13C:
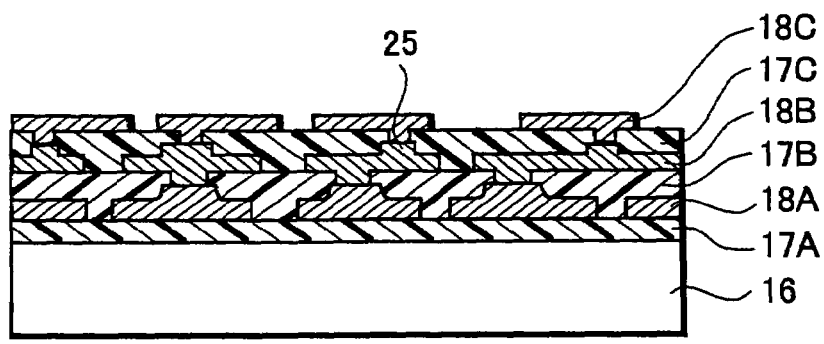

With reference to FIG. 13A, by forming the second connection part 25B, a connection part 25 including the first and second connection parts 25A and 25B is formed. Moreover, with reference to FIG. 13B, by performing selective etching using a resist 29E, the second wiring layer 18B is formed. Furthermore, with reference to FIG. 13C, here, a three-layer wiring structure including the first to third wiring layers 18A to 18C is formed. In this case, the connection parts 25 protruded in a convex shape are formed on both upper and lower the surfaces of the second wiring layer 18B.

Figure 14A:
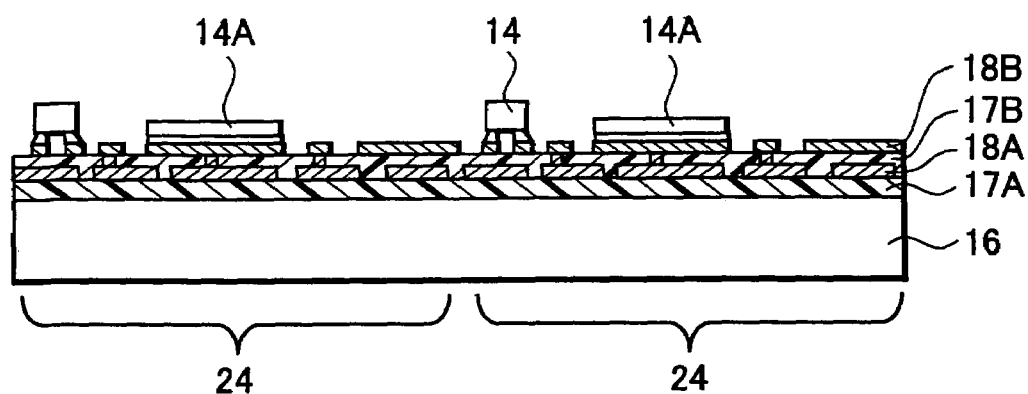
FIGS. 14A and 14B are cross-sectional views showing the method for manufacturing a hybrid integrated circuit device according to the embodiment of the invention.
Figure 14B:
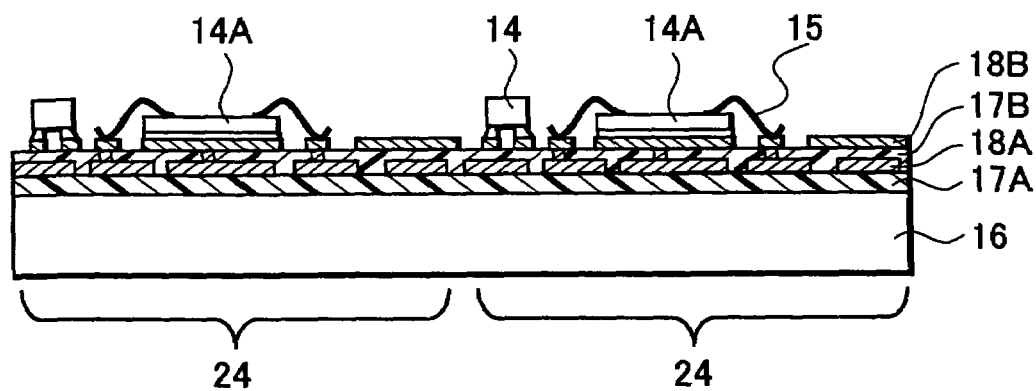

With reference to FIG. 14A, next, a circuit element 14 is fixed onto the second wiring layer 18B (island) by use of solder, a conductive paste or the like. Although, here, an active element is mounted face up, the element may be mounted face down if needed. Moreover, with reference to FIG. 14B, a semiconductor element 14A and the second wiring layer 18B are electrically connected to each other through thin metal wires 15.

After the foregoing steps are finished, each unit 24 is separated. The respective units 24 can be separated by punching using a press machine, dicing, bending or the like. Thereafter, the leads 11 are fixed to the circuit board 16 of each unit 24.

Figure 15:
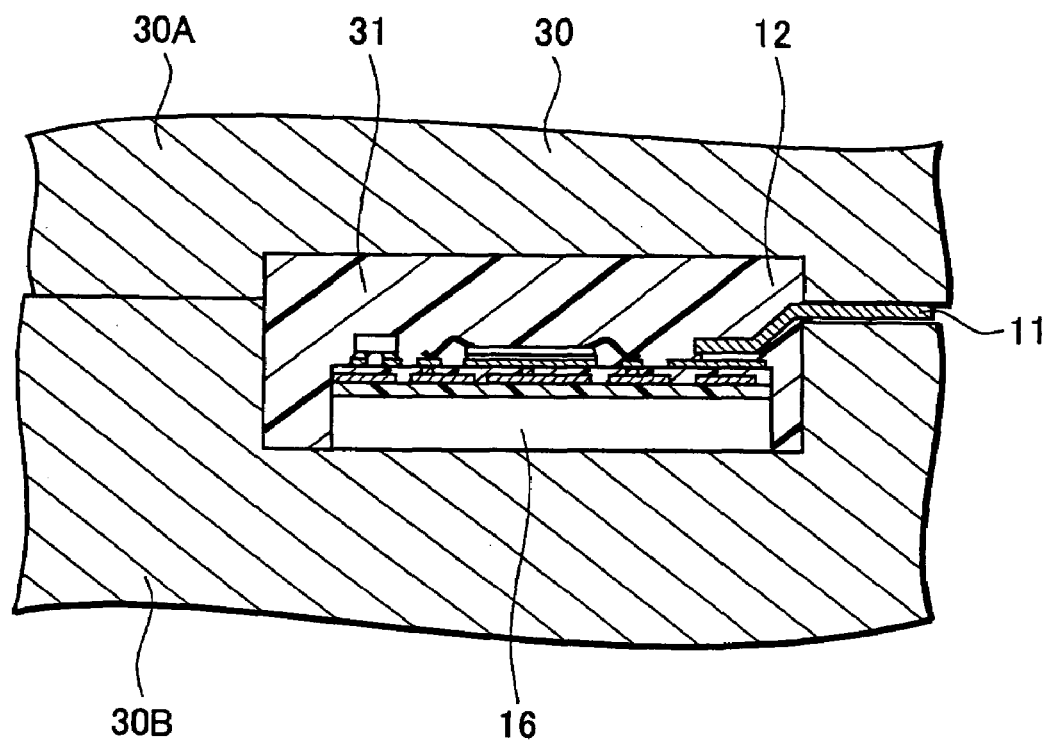
FIG. 15 is a cross-sectional view showing the method for manufacturing a hybrid integrated circuit device according to the embodiment of the invention.

With reference to FIG. 15, next, resin sealing of each circuit board 16 is performed. Here, sealing is performed by transfer molding using a thermosetting resin. Specifically, after the circuit board 16 is housed in a mold 30 formed of an upper mold 30A and a lower mold 30B, the both molds are engaged with each other to fix the leads 11. Subsequently, the resin sealing step is performed by injecting a resin into a cavity 31. By the steps described above, the hybrid integrated circuit device having the structure shown in FIGS. 1A to 1C, for example, is manufactured.

What is claimed is:

1. A circuit device comprising:
    first and second wiring layers which are laminated with an insulating layer interposed therebetween;
    a first connection part which protrudes integrally from the first wiring layer and is buried in the insulating layer; and
    a second connection part which protrudes integrally from the second wiring layer and is buried in the insulating layer,
    wherein the first and second connection parts come into contact with each other in an intermediate portion of the insulating layer in its thickness direction, and
    wherein the insulating layer is made of a resin containing fillers.

2. The circuit device according to claim 1, wherein any of the first and second connection parts is formed by etching one piece of a copper foil.

3. The circuit device according to claim 1, wherein any of the first and second connection parts is made of a plated film.

4. The circuit device according to claim 1, wherein the first connection part is formed by etching one piece of a copper foil, and the second connection part is made of a plated film.

5. The circuit device according to claim 1, wherein the first and second wiring layers are formed on the surface of a circuit board having its surface insulated.

6. The circuit device according to claim 1, wherein the first and second connection parts are made of different materials.

7. A circuit device which at least includes a supporting board having at least its surface insulated, and a semiconductor element formed on the supporting board, wherein
    a second wiring layer is provided on a first wiring layer on the supporting board with an insulating layer interposed therebetween,
    in a portion corresponding to an electrical connection part between the first and second wiring layers, provided are a first connection part facing upward protruding integrally from the first wiring layer, and a second connection part facing downward protruding integrally from the second wiring layer, and
    a contact portion between the first and second connection parts is positioned between the upper surface of the first connection part and the lower surface of the second connection part.

8. The circuit device according to claim 7, wherein the contact portion is disposed in a position not less than half a distance between the upper surface of the first connection part and the lower surface of the second connection part.

9. The circuit device according to claim 7, wherein the first and second connection parts are made of different materials.

* * * * *